United States Patent
Wu et al.

(10) Patent No.: US 8,406,271 B2
(45) Date of Patent: Mar. 26, 2013

(54) SPREAD SPECTRUM CLOCK GENERATING CIRCUIT

(75) Inventors: Guosheng Wu, Chengdu (CN); Ziche Zhang, Chengdu (CN)

(73) Assignee: IPGoal Microelectronics(SiChuan) Co., Ltd, Chengdu, Sichuan Province (CN)

( * ) Notice: Subject to any disclaimer, the term of this patent is extended or adjusted under 35 U.S.C. 154(b) by 330 days.

(21) Appl. No.: 12/860,685

(22) Filed: Aug. 20, 2010

(65) Prior Publication Data
US 2011/0051779 A1    Mar. 3, 2011

(30) Foreign Application Priority Data
Aug. 27, 2009 (CN) .......................... 2009 1 0164269

(51) Int. Cl.
*H04B 1/707* (2006.01)
(52) U.S. Cl. ........................................................ 375/130
(58) Field of Classification Search .................. 375/130, 375/140, 373, 376, 377; 327/291, 156
See application file for complete search history.

(56) References Cited

U.S. PATENT DOCUMENTS
7,986,175 B2 * 7/2011 Ebuchi et al. ................. 327/147

FOREIGN PATENT DOCUMENTS
WO    WO 2008/146433    * 12/2008

* cited by examiner

*Primary Examiner* — Kevin Kim

(57) ABSTRACT

A spread spectrum generating circuit comprises an external PLL and an internal PLL. The external PLL comprises a phase detector, a low-pass filter, a voltage-controlled oscillator and a frequency divider, each of them connecting successively. The frequency divider is connected to the phase detector in order to form an external loop. The internal PLL comprises the phase detector, the low-pass filter and the voltage-controlled oscillator of the external PLL, each of them connecting successively. An output terminal of the voltage-controlled oscillator connects with a counter, and the output terminal of the counter connects to an input of the oscillator in order to form an internal loop. The present invention is compatible with the conventional ones, and has lower design risk and higher circuit reliability; compared with the general circuit, it has drastically reduced the area and power consumption, which allows more flexible design and meets more demands.

5 Claims, 1 Drawing Sheet

SPREAD SPECTRUM CLOCK GENERATING CIRCUIT

BACKGROUND OF THE PRESENT INVENTION

1. Field of Invention

The present invention pertains to the IC field, more specifically, to a spread spectrum clock generating circuit.

2. Description of Related Art

The spread spectrum clock is applied widely in the integrated circuit system to reduce EMI (Electromagnetic interference).

The general way to obtain a spread spectrum clock is to gate each outputted phase of interpolators in turn, and then reconstruct the clock. However, the conventional method requires a complicated interpolation circuit with high-accuracy, a delay line circuit with all delay cells matching with each other, a multi-phase judging digital filtering circuit, a high-speed digital multiplexer circuit, and so on. As a result, the conventional method has led to a very complicated circuit, which in turn has increased the area and power consumption of circuits. In addition, due to nonlinear attribute of interpolators and delay mismatching of various hierarchies of the delay line circuit, the frequency change of finally obtained spread spectrum clock will be quite non-linear.

SUMMARY OF THE PRESENT INVENTION

The object of the present invention is to provide a spread spectrum clock generating circuit to achieve a high-accuracy circuit, reduce drastically the area and power consumption of the circuit and improve reliability.

Accordingly, in order to accomplish the above object, the present invention provides a spread spectrum clock generating circuit comprising an external PLL; and an internal PLL, wherein said external PLL comprises of a phase detector, a low-pass filter, a voltage-controlled oscillator and a frequency divider, each of them connecting successively, wherein the frequency divider is connected to the phase detector in order to form an external loop;

said internal PLL comprises of the phase detector, low-pass filter and the voltage-controlled oscillator of said external PLL, each of them connecting successively, wherein the output terminal of the voltage-controlled oscillator is connected with a counter, and the output terminal of the counter is connected to an input of the oscillator in order to form an internal loop.

Said phase detector has two input clock signal, one is a reference clock and the other is a feedback clock, and two output signals which correspond in phase to the two input signals, UP and DW. The two outputted signals are outputted to a low-pass filter. The low-pass outputs level signals into a voltage-controlled oscillator and then the oscillator outputs a spread spectrum clock. After having been divided by a frequency divider, the spread spectrum clock has generated a feedback clock, and then the feedback clock is outputted through the output of the frequency divider to the input terminal of the phase detector in order to form an external phase-locked loop.

The direct outputting clock of the voltage-controlled oscillator outputs a spread spectrum clock through an output buffer; the outputted spread spectrum clock is also sent to a counter; after counting M clock cycles (M is a natural number chosen based on the spread spectrum circuit demand), the counter outputs an pulse signal and sends the pulse signal into the input terminal of the voltage-controlled oscillator so as to form an internal loop.

Said spread spectrum generating circuit has following working principle: when working normally, once the external PLL gets into a locked status (namely, from being connected to a power supply till the loop is locked, the time interval for outputting a steady time is less than 100 us), the oscillator controls and keeps the voltage in a constant value, and then outputs a spread spectrum clock into the counter. After counting M clock cycles, the counter outputs a pulse signal and simultaneously gets cleared. The pulse signal will change periodically one of three electric characteristics and in turn change periodically the frequency of the direct outputting clock of the oscillator. The three characteristics are currents of the current source of the output drive of the voltage-controlled oscillator, currents of the current sink of the output drive of the voltage-controlled oscillator, and the load capacity of the load network of the voltage-controlled oscillator.

The specific process during which how the three electric characteristics change the frequency of the directly outputted clock is as follows:

The bigger the currents of the current source of the output drive of the voltage-controlled oscillator are, the shorter the rise time of the direct outputting clock is; meanwhile, because the fall time of the direct outputting clock is not changing, the total cycle becomes shorter, and thus the frequency becomes bigger. Contrarily, the less the currents of the current source are, the shorter the fall time of the direct outputting clock is; since the rise time is not changing, the total cycle is getting longer, and accordingly the frequency is getting less.

The bigger the currents of the current sink of the output drive of the voltage-controlled oscillator are, the shorter the fall time of the direct outputting clock is; meanwhile, since the rise time of the direct outputting clock is not going to change, the shorter the total cycle is, the bigger the frequency is. Contrarily, the less the currents of the current sink, the shorter the rise time; also, because of the unchanging fall time, the longer the total cycle, the less the frequency.

The less the load capacity of the load network of the voltage-controlled oscillator, the shorter the rise time of the direct outputting clock, meanwhile, fall time gets shorter, the total cycle gets shorter and the frequency gets bigger. Contrarily, the more the load capacity of the load network, the shorter the fall time of the direct outputting clock, meanwhile, the rise time gets shorter, the total cycle gets longer and the frequency gets less.

The present invention has following advantages:

1. is compatible with the conventional PLL, thus has reduced the risk of a totally new design and has improved reliability of circuits;
2. the core part of the internal loop is just a M bit counter (M is a natural number), which has drastically reduced the circuit area and power consumption, compared with general spread spectrum circuits;
3. the physical quantities of electric characteristics, such as the magnitude and direction, controlled by a pulse signal, and the cycle M can be set randomly to meet various spread spectrum demands.

These and other objectives, features, and advantages of the present invention will become apparent from the following detailed description, the accompanying drawings, and the appended claims.

DETAILED DESCRIPTION OF THE PREFERRED EMBODIMENT

Figure 1:
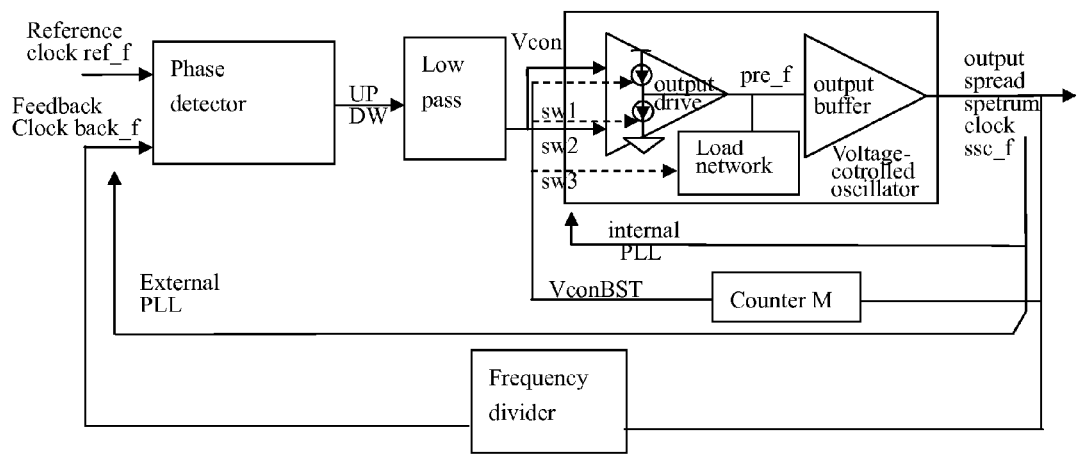
FIG. 1 is a schematic circuit diagram of the present invention.
Figure 2:
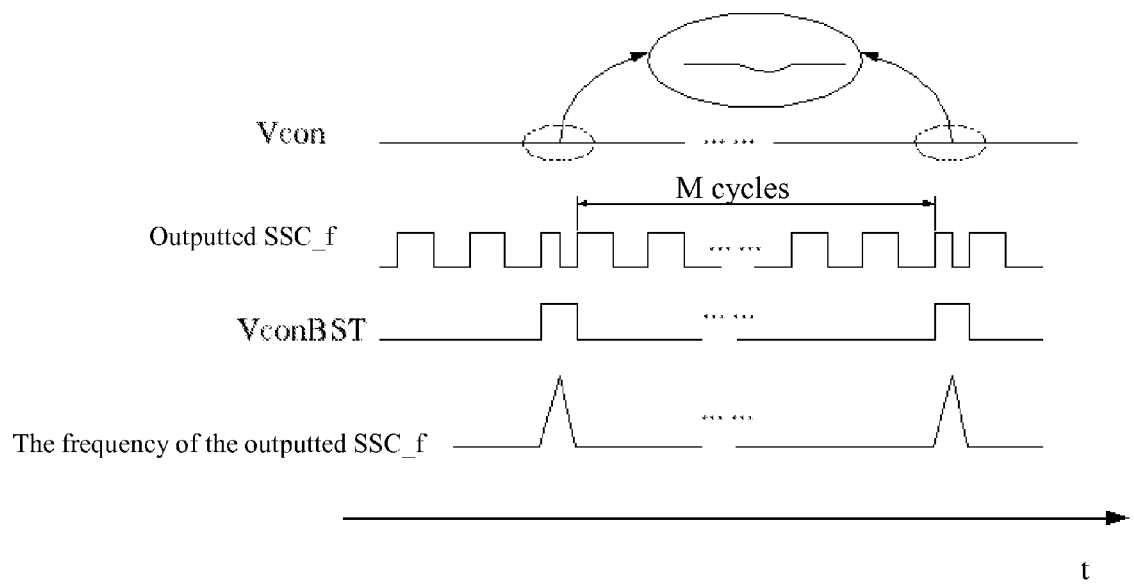
FIG. 2 is a schematic waveform diagram of key points when the present invention works normally.

Referring to FIG. 1 and FIG. 2, a spread spectrum clock generating circuit comprises an external phase-locked loop and an internal phase-locked loop.

Said external PLL comprises of a phase detector, a low-pass filter, a voltage-controlled oscillator and a frequency divider, each of them connecting successively, and the frequency divider connects to the phase detector in order to form an external loop.

Said internal PLL comprises of the phase detector, low-pass filter and voltage-controlled oscillator of said external PLL, each of them connecting successively, wherein the output terminal of the voltage-controlled oscillator connects with a counter, and the output terminal of the counter connects to an input of the oscillator in order to form an internal loop.

Said phase detector has two input clock signals, one is a reference clock and the other one is a feedback clock, and two output signals which correspond in phase to the two input signals, UP and DW. The two outputted signals are further outputted to a low-pass filter. The low-pass outputs a level signal, Vcon, into a voltage-controlled oscillator and then the oscillator outputs a spread spectrum clock. After having been divided by a frequency divider, the spread spectrum clock has generated a feedback clock, and then the feedback clock is outputted through the output of the frequency divider to the input terminal of the phase detector in order to form an external phase-locked loop.

The direct outputting clock, pre_f, of the voltage-controlled oscillator outputs a spread spectrum clock, ssc_f, through an output buffer; the outputted spread spectrum clock is also sent to a counter; after counting M clock cycles (M is a natural number selected randomly), the counter outputs an pulse signal and sends the pulse signal into the input terminal of the voltage-controlled oscillator so as to form an internal loop.

Said spread spectrum generating circuit has following working principle: when working normally, once the external PLL gets into a locked status (namely, from being connected to a power supply till the loop is locked, the time interval for outputting a steady time is less than 100us), the oscillator controls and keeps a constant voltage, and then outputs a spread spectrum clock into the counter. After counting M clock cycles, the counter outputs a pulse signal, VconBST, and simultaneously gets cleared. The pulse signal VconBST will change periodically one of three electric characteristics so as to change periodically the frequency of the direct outputting clock of the oscillator: currents of the current source of the output drive of the voltage-controlled oscillator (VconBS is taken as a controlling amount of switch SW1; SW1 controls whether or not currents in parallel are merged into currents of the current source of the output drive), currents of the current sink of the output drive of the voltage-controlled oscillator (VconBS is taken as a controlling amount of switch SW2; SW2 controls whether or not currents in parallel are merged into currents of the current sink of the output drive), and the load capacity of the load network of the voltage-controlled oscillator (VconBS is taken as a controlling amount of switch SW3; SW3 controls whether or not loads in parallel are incorporated into the load capacity of the load network).

The specific process during which how the three electric characteristics change the frequency of the directly outputted clock is as follows:

The bigger the currents of the current source of the output drive of the voltage-controlled oscillator are, the shorter the rise time of the direct outputting clock, pre_f, is; meanwhile, because the fall time of the direct outputting clock is not going to change, so the shorter the total cycle is, the bigger the frequency is. Contrarily, the less the currents of the current source are, the shorter the fall time of the direct outputting clock pre_f is; since the rise time is not going to changing, the longer the total cycle is, and the less the frequency is.

The bigger the currents of the current sink of the output drive of the voltage-controlled oscillator are, the shorter the fall time of the direct outputting clock, pre_f, is; meanwhile, since the rise time of the direct outputting clock, pre_f, is not going to change, the shorter the total cycle is, the bigger the frequency is. Contrarily, the less the currents of the current sink, the shorter the rise time of the direct outputting clock, pre_f, is; also, because of the unchanging fall time, the longer the total cycle, the less the frequency.

The less the load capacity of the load network of the voltage-controlled oscillator, the shorter the rise time of the direct outputting clock, pre_f, is; meanwhile, the fall time gets shorter, accordingly the shorter the total cycle, the bigger the frequency. Contrarily, the more the load capacity of the load network, the shorter the fall time of the direct outputting clock, pre_f, is; meanwhile, the rise time gets shorter, so the longer the total cycle gets, the less the frequency gets.

Because the bandwidth of the external PLL of the present invention is less, so its responses to single cycle changes of the outputting clock is insensitive, and level signals hardly change right before and right after a pulse signal appears, therefore, the clock line of the outputted clock by the voltage-controlled oscillator jumps only within one cycle, which meets the requirements of a spread spectrum clock.

One skilled in the art will understand that the embodiment of the present invention as shown in the drawings and described above is exemplary only and not intended to be limiting. It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A spread spectrum clock generating circuit, comprising:
an external PLL (phase-locked loop); and
an internal PLL,
wherein the external PLL comprises a phase detector, a low-pass filter, a voltage-controlled oscillator and a frequency divider, each of them connecting successively, wherein the frequency divider is connected to the phase detector in order to form an external loop;
the internal PLL comprises the phase detector, the low-pass filter and the voltage-controlled oscillator of the external PLL, each of them connecting successively, wherein an output terminal of the voltage-controlled oscillator is connected with a counter, and an output terminal of the counter is connected to an input terminal of the oscillator in order to form an internal loop,
wherein a direct outputting clock of the voltage-controlled oscillator outputs a spread spectrum clock through an output buffer;

the outputted spread spectrum clock is also sent to the counter;

after counting M clock cycles, the counter outputs a pulse signal and sends the pulse signal into the input terminal of the voltage-controlled oscillator so as to form the internal loop, wherein M is a natural number selected randomly.

2. The spread spectrum clock generating circuit, as recited in claim 1, wherein the phase detector has two input clock signals, one is a reference clock and the other one is a feedback clock, and two output signals which respectively correspond in phase to the two input signals;

the two outputted signals are further outputted to the low-pass filter;

the low-pass filter outputs level signals into the voltage-controlled oscillator and then the oscillator outputs the spread spectrum clock;

after having been divided by the frequency divider, the spread spectrum clock generates the feedback clock, and then the feedback clock is outputted through an output of the frequency divider to an input terminal of the phase detector in order to form the external phase-locked loop.

3. A spread spectrum clock generating circuit, comprising:
an external PLL (phase-locked loop); and
an internal PLL,
wherein the external PLL comprises a phase detector, a low-pass filter, a voltage-controlled oscillator and a frequency divider, each of them connecting successively, wherein the frequency divider is connected to the phase detector in order to form an external loop;
the internal PLL comprises the phase detector, the low-pass filter and the voltage-controlled oscillator of the external PLL, each of them connecting successively, wherein an output terminal of the voltage-controlled oscillator is connected with a counter, and an output terminal of the counter is connected to an input terminal of the oscillator in order to form an internal loop,
wherein when working normally, once the external PLL gets into a locked status, the voltage-controlled oscillator controls and keeps a constant voltage, and then outputs a spread spectrum clock into the counter;
after counting M clock cycles, the counter outputs a pulse signal and simultaneously gets cleared.

4. The spread spectrum clock generating circuit, as recited in claim 3, wherein the pulse signal will change periodically one of three electric characteristics in order to change periodically a frequency of a direct outputting clock of the voltage-controlled oscillator—currents of a current source of an output drive of the voltage-controlled oscillator, currents of a current sink of the output drive of the voltage-controlled oscillator, and a load capacity of a load network of the voltage-controlled oscillator.

5. The spread spectrum clock generating circuit, as recited in claim 4, wherein the three electric characteristics have a following process to change the frequency of the direct outputting clock:

the bigger the currents of the current source of the output drive of the voltage-controlled oscillator are, the shorter a rise time of the direct outputting clock is; meanwhile, a fall time of the direct outputting clock is not going to change, so the shorter a total cycle is, the bigger the frequency is; contrarily, the less the currents of the current source are, the shorter the fall time of the direct outputting clock is; since the rise time is not going to change, the longer the total cycle is, and the less the frequency is;

the bigger the currents of the current sink of the output drive of the voltage-controlled oscillator are, the shorter the fall time of the direct outputting clock is; meanwhile, since the rise time of the direct outputting clock is not going to change, the shorter the total cycle is, the bigger the frequency is; contrarily, the less the currents of the current sink, the shorter the rise time; also, because of the unchanging fall time, the longer the total cycle, the less the frequency;

the less the load capacity of the load network of the voltage-controlled oscillator, the shorter the rise time of the direct outputting clock, meanwhile, the fall time gets shorter, accordingly the shorter the total cycle, the bigger the frequency; contrarily, the more the load capacity of the load network, the shorter the fall time of the direct outputting clock; meanwhile, the rise time gets shorter, so the longer the total cycle gets, the less the frequency gets.

\* \* \* \* \*